United States Patent
Yoon et al.

(10) Patent No.: US 8,012,792 B2
(45) Date of Patent: Sep. 6, 2011

(54) COMPOSITE PHOSPHOR POWDER, LIGHT EMITTING DEVICE USING THE SAME AND METHOD FOR MANUFACTURING COMPOSITE PHOSHPOR POWDER

(75) Inventors: Chulsoo Yoon, Kyungki-do (KR); Joon Ho Yoon, Seoul (KR); Chang Hoon Kwak, Seoul (KR); Yun Seup Chung, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

(21) Appl. No.: 12/909,358

(22) Filed: Oct. 21, 2010

(65) Prior Publication Data
US 2011/0031521 A1    Feb. 10, 2011

Related U.S. Application Data

(62) Division of application No. 11/508,143, filed on Aug. 23, 2006, now Pat. No. 7,832,312.

(30) Foreign Application Priority Data

Aug. 23, 2005  (KR) ........................ 10-2005-0077399

(51) Int. Cl.
*B32B 5/16*    (2006.01)
(52) U.S. Cl. .................................. 438/99; 252/62.51 R
(58) Field of Classification Search ............... 438/99; 252/62.51 R
See application file for complete search history.

(56) References Cited

U.S. PATENT DOCUMENTS

| | | |
|---|---|---|
| 2003/0122482 A1 | 7/2003 | Yamanaka et al. |
| 2003/0168669 A1 | 9/2003 | Chua |
| 2004/0104391 A1 | 6/2004 | Maeda et al. |
| 2005/0224828 A1 | 10/2005 | Oon et al. |
| 2006/0076879 A1 | 4/2006 | Kwon |
| 2006/0118757 A1 * | 6/2006 | Klimov et al. ......... 252/62.51 R |

FOREIGN PATENT DOCUMENTS

| | | |
|---|---|---|
| GB | 1 484 471 | 9/1977 |
| JP | 2002-223008 | 8/2002 |
| JP | 2002-374006 | 12/2002 |
| JP | 2003-046141 | 2/2003 |
| JP | 2003-286480 | 10/2003 |
| JP | 2005-187797 | 7/2005 |
| KR | 2003-0063832 A | 7/2003 |
| WO | WO 01/24229 | 4/2001 |
| WO | WO 2005/103199 A1 | 11/2005 |

OTHER PUBLICATIONS

Japanese Office Action issued in Japanese Patent Application No. JP 2006-226709 dated Feb. 10, 2009.

* cited by examiner

*Primary Examiner* — Thomas L Dickey
(74) *Attorney, Agent, or Firm* — McDermott Will & Emery LLP

(57) ABSTRACT

The invention provides a high quality composite phosphor powder which ensures diversity in emission spectrum, color reproduction index, color temperature and color, a light emitting device using the same and a method for manufacturing the composite phosphor powder. The composite phosphor powder comprises composite particles. Each of the composite particles includes at least two types of phosphor particles and a light transmitting binder. The phosphor particles have different emission spectrums. In addition, the light transmitting binder is formed between the phosphor particles and binds them together.

8 Claims, 13 Drawing Sheets

COMPOSITE PHOSPHOR POWDER, LIGHT EMITTING DEVICE USING THE SAME AND METHOD FOR MANUFACTURING COMPOSITE PHOSHPOR POWDER

RELATED APPLICATION APPLICATIONS

This application is a Divisional of U.S. patent application Ser. No. 11/508,143, filed on Aug. 23, 2006 now U.S. Pat. No. 7,832,312, and claims the benefit of Korean Patent Application No. 2005-77399 filed on Aug. 23, 2005 in the Korean Intellectual Property Office, the entire contents of each of which are incorporated herein by reference.

BACKGROUND OF THE INVENTION

1. Field of the Invention

The present invention relates to a phosphor powder, and more particularly, a composite phosphor powder which emits light in a variety of spectrums and produces color temperature, color reproduction index and color precisely tailored to needs.

2. Description of the Related Art

A phosphor is utilized in a wide range of light emitting devices such as a light emitting diode device. The phosphor converts various excitation energies such as photon, electron, heat and electric field into visible light. In order to obtain a desired emission wavelength, an adequate activator ion and a matrix material are synthesized to manufacture a phosphor. An excitation energy transferred through a matrix of the phosphor to the active ion is converted to visible light, thereby emitting light. Here, the emission wavelength is determined by combination of a given matrix and an activator doped therein. As a result, the phosphor carries its own emission wavelength and accordingly is extremely limited in altering the emission wavelength as desired.

FIG. 1 illustrates a spectrum of a conventional red phosphor and FIG. 2 illustrates a spectrum of a conventional green phosphor. FIG. 1 is a graph illustrating an emission spectrum of SrS:Eu phosphor which is a red phosphor. FIG. 2 is a graph illustrating an emission spectrum of $SrGa_2S_4$:Eu phosphor which is a green phosphor. As shown in FIGS. 1 and 2, the phosphors each emit light in a specified wavelength range. As just described, only one type of phosphor fails to produce a variety of colors and emission spectrums, and moreover extremely limited types of the phosphors emit light at a desired wavelength.

In a method to overcome this problem, several types of phosphors have been mixed together. For example, in a light emitting device having an LED element (LED chip) mounted thereon, several types of phosphors are mixed to emit light in a broad wavelength range (e.g., white light emission). FIG. 3 illustrates an example thereof.

Referring to FIG. 3, a light emitting device 10 includes a blue LED chip 18 mounted in a recess of a housing 11. Terminal electrodes 12 are connected to the LED chip via bonding wires 19. Over the LED chip 18, a first phosphor (e.g., a red phosphor) 13 and a second phosphor (e.g., a green phosphor) 14 are mixed in a molding resin 15 such as epoxy. However, owing to density differences between the first phosphor 13 and the second phosphor 14, the phosphor of high density (the second phosphor) sinks and the phosphor of low density (the first phosphor) floats (a layering phenomenon). This fails to produce color reproduction index and emission spectrum as originally designed or expected, resulting in uneven color.

SUMMARY OF THE INVENTION

The present invention has been made to solve the foregoing problems of the prior art and therefore an object according to certain embodiments of the present invention is to provide a composite phosphor powder which emits light at a variety of spectrums and precisely ensures diversity in color temperature, color and color reproduction index.

Another object according to certain embodiments of the invention is to provide a method for manufacturing a composite phosphor powder which emits light in a variety of spectrums and precisely ensures diversity in color temperature, color and color reproduction index.

Further another object according to certain embodiments of the invention is to provide a light emitting device which employs a composite phosphor powder to precisely ensure diversity in emission spectrum, color temperature, color and color reproduction index.

According to an aspect of the invention for realizing the object, there is provided a composite phosphor powder comprising composite particles, wherein each of the composite particles comprises at least two types of phosphor particles having different emission spectrums and a light transmitting binder for binding the phosphor particles, the light transmitting binder formed between the phosphor particles.

According to an embodiment of the invention, the phosphor particles of the each composite particle have different peak emission wavelengths.

This allows the composite phosphor powder to exhibit emission spectrums peculiar to each of the phosphor particles, and other new broader emission spectrums. Also, the emission spectrums can be adjusted by varying relative contents of the phosphor particles comprising the composite particles.

According to an embodiment of the invention, the light transmitting binder comprises a light transmitting polymer resin. Preferably, the light transmitting binder comprises an epoxy resin or a silicone resin. The light transmitting binder binds the phosphor particles together into a composite particle.

Preferably, the composite phosphor particles have a mean diameter of 10 to 100 μm. More preferably, the composite phosphor particles have a mean diameter of 20 to 50 μm. Preferably, to obtain uniform color of light emitted, the composite particles are uniformly sized.

According to an embodiment of the invention, the each composite particle includes a red phosphor and a green phosphor. For example, the each composite particle comprises SrS:Eu and $SrGa_2S_4$:Eu at a various ratio.

According to another embodiment of the invention, the each composite particle includes a green phosphor and a yellow phosphor. For example, the each composite particle comprises $SrGa_2S_4$:Eu and YAG:Ce at a various ratio.

According to further another embodiment of the invention, the each composite particle includes a red phosphor, a green phosphor and a yellow phosphor. For example, the each composite particle comprises SrS:Eu, $SrGa_2S_4$:Eu and YAG:Ce at a various ratio.

According to still another embodiment of the invention, the each composite particle comprises a red phosphor, a green phosphor, a yellow phosphor and an orange phosphor. For example, the each composite particle comprises SrS:Eu, $SrGa_2S_4$:Eu, YAG:Ce and ZnSeS:Cu at a various ratio.

According to another aspect of the invention for realizing the object, there is provided a method for manufacturing a composite phosphor powder, comprising steps of:

mixing at least two types of phosphor particles with a light transmitting binder to form a precursor of a composite phosphor;

mixing a dispersion medium added with a surfactant with the precursor and stirring the mixture to form stabilized unit particles of the composite phosphor within the dispersion medium; and heating the dispersion medium to cure the light transmitting binder, thereby solidifying composite phosphor particles.

Preferably, the light transmitting binder comprises an epoxy resin or a silicone resin. Preferably, the dispersion medium comprises distilled water. In this case, a water hardening agent is added to the precursor. Also, the surfactant may comprise Poly Acryl Amide (PAA). Alternatively, the dispersion medium comprises alcohol such as ethyl alcohol.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings. It is intended, however, that the embodiments shall be interpreted as illustrative only, but various variations and modifications can be made without departing from the scope of the invention.

Figure 4:
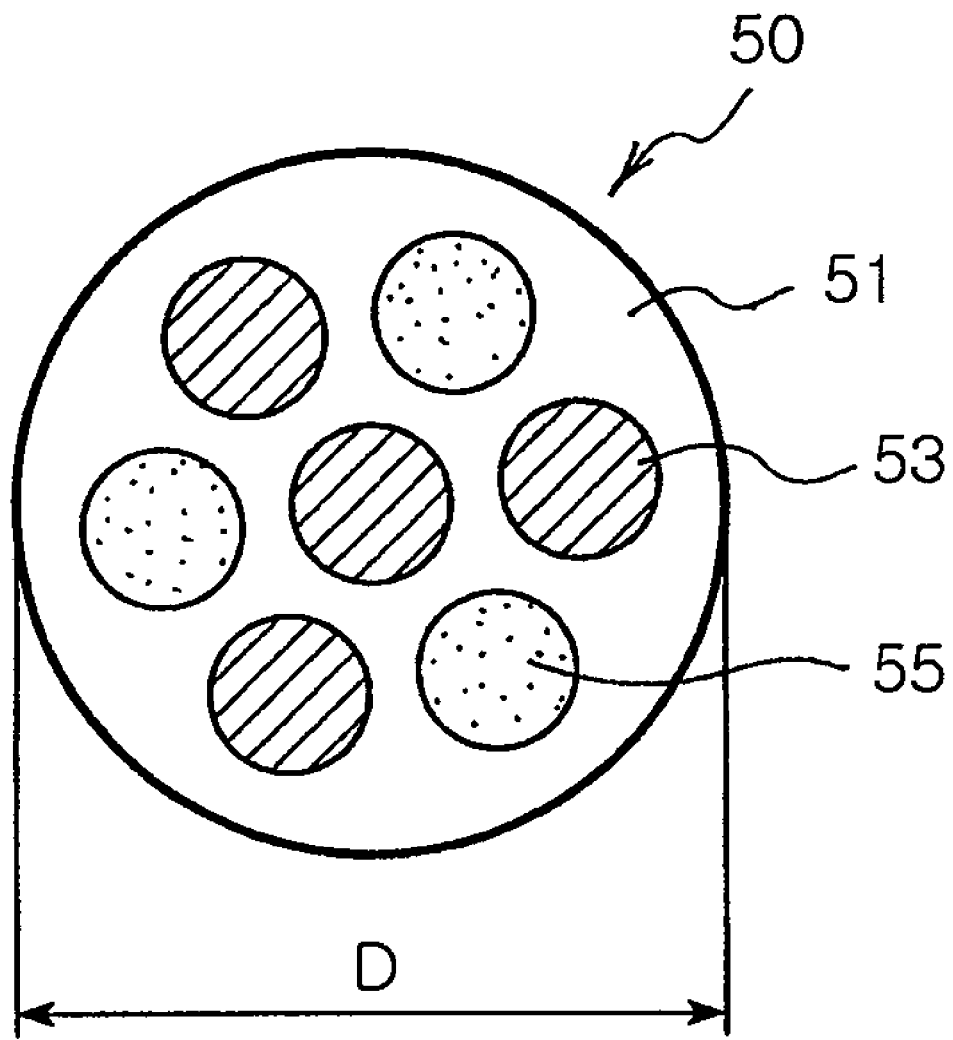
FIG. 4 is a schematic view illustrating a composite phosphor particle according to an embodiment of the invention.

FIG. 4 is a schematic view illustrating a composite phosphor particle according to an embodiment of the invention. A composite phosphor powder is comprised of composite phosphor particles. Referring to FIG. 4, a composite particle containing phosphors, i.e., the composite phosphor particle 50 contains two different types of phosphors 53 and 55, which differ in the emission spectrum. Preferably, the phosphors 53 and 55 of the composite phosphor particle 50 exhibit different peak emission wavelengths. Also, a light transmitting binder 51 is formed between the phosphors 53 and 55 to bind them together. The light transmitting binder 51 may adopt a light transmitting polymer resin such as an epoxy resin or a silicone resin.

The phosphors 53 and 55 can be contained at an adjustable ratio depending on needs. In this fashion, two types of phosphors having different emission spectrums are combined at a various ratio into a composite particle, thereby achieving uniformity in color and diversity in emission spectrum, color reproduction index and color temperature. The two phosphors 53 and 55 are exemplified by a red phosphor and a green phosphor. Alternatively, the phosphors 53 and 55 may adopt a green phosphor and a yellow phosphor.

The composite phosphor particle 50 has a mean diameter of 10 to 100 μm, preferably 20 to 50 μm. Preferably, composite phosphor particles 50 within the composite phosphor powder have a uniform diameter D overall. This is because the uniformly sized composite particles more contribute to uniform color. According to the invention, individual phosphors contained in the composite phosphor particle are not limited to only two types. Optionally at least three types of phosphors are contained at a various ratio in the composite phosphor particle.

Figure 5:
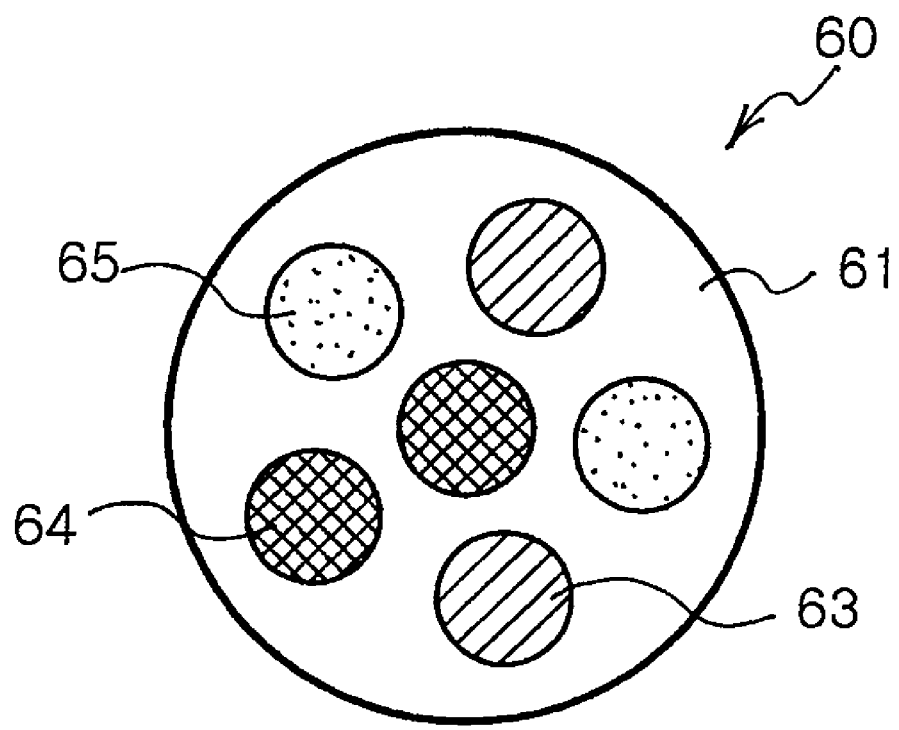
FIG. 5 is a schematic view illustrating a composite phosphor particle according to another embodiment of the invention.

FIG. 5 is a schematic view illustrating a composite phosphor particle according to another embodiment of the invention. Referring to FIG. 5, the composite phosphor particle 60 includes a light transmitting binder 61 such as an epoxy resin and three different types of phosphor particles 63, 64 and 65 bound thereby. The phosphors 63, 64 and 65 feature different emission spectrums (preferably different peak emission wavelengths). For example, the phosphors 63, 64 and 65 may adopt a red phosphor, a green phosphor and a yellow phosphor. A composite phosphor powder comprised of composite phosphor particles produces visible light of a broad wavelength range, and ensures diversity in emission spectrum, color temperatures, color reproduction index and color. Especially, this prevents incidence of a layering phenomenon as in the prior art, thereby producing more uniform color and the emission spectrum precisely as designed.

FIGS. 6 to 11 are graphs illustrating emission spectrums of composite phosphor powders according to various embodiments of the invention. The composite phosphor powders whose spectrums are plotted in FIGS. 6 to 11 employ an epoxy resin as a light transmitting binder.

Figure 1:
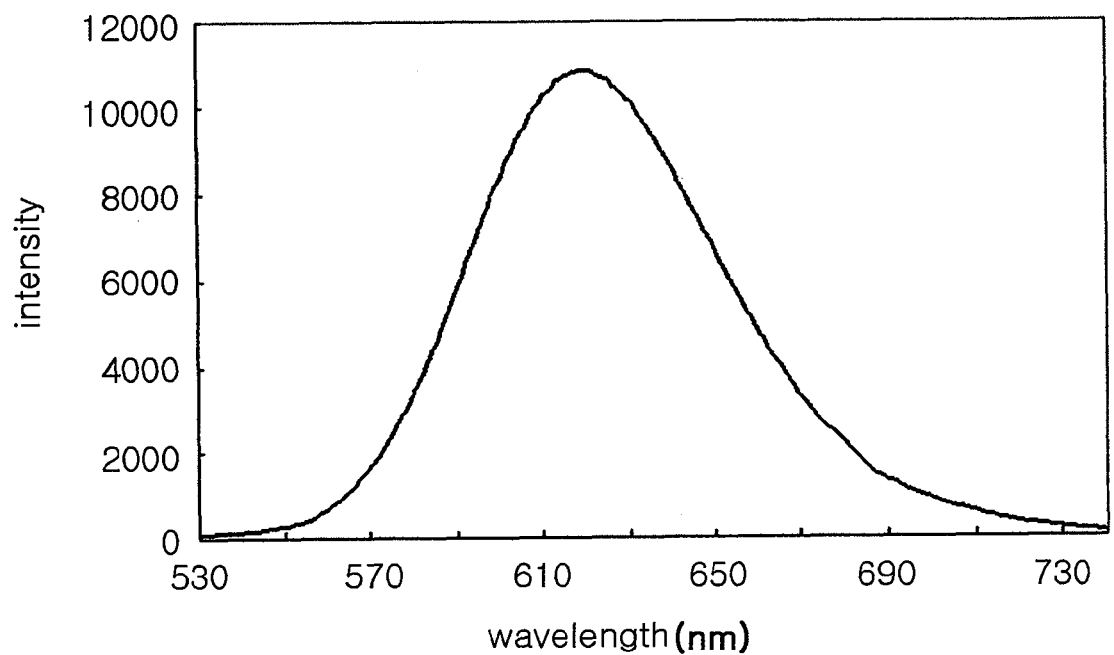
FIG. 1 is a graph illustrating an emission spectrum of a conventional red phosphor.
Figure 2:
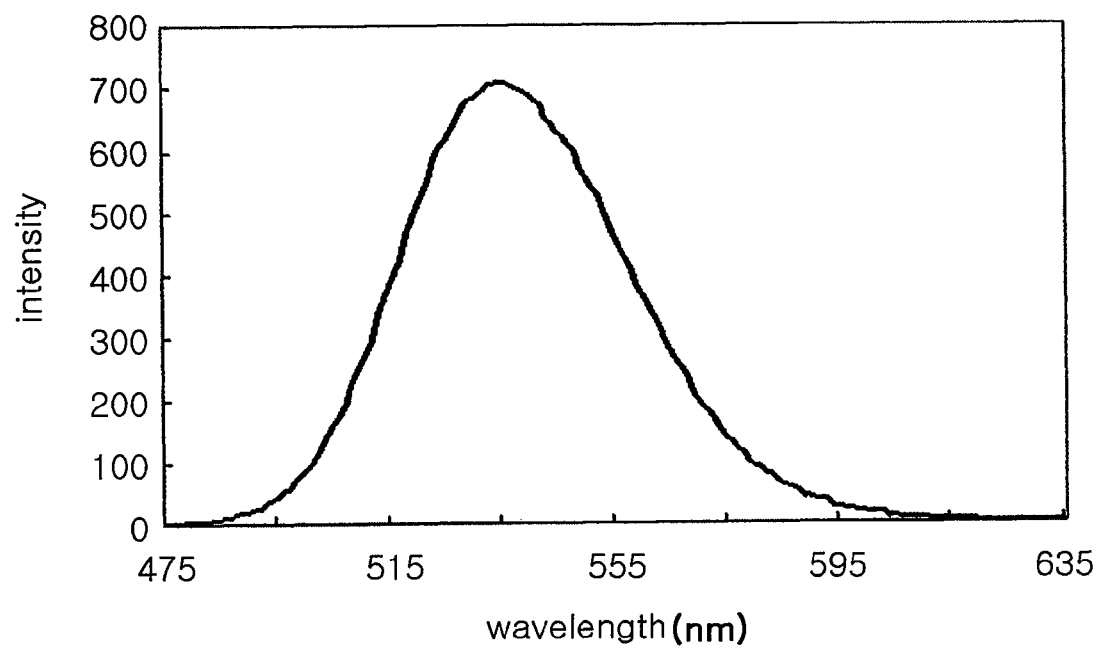
FIG. 2 is a graph illustrating an emission spectrum of a conventional green phosphor.
Figure 3:
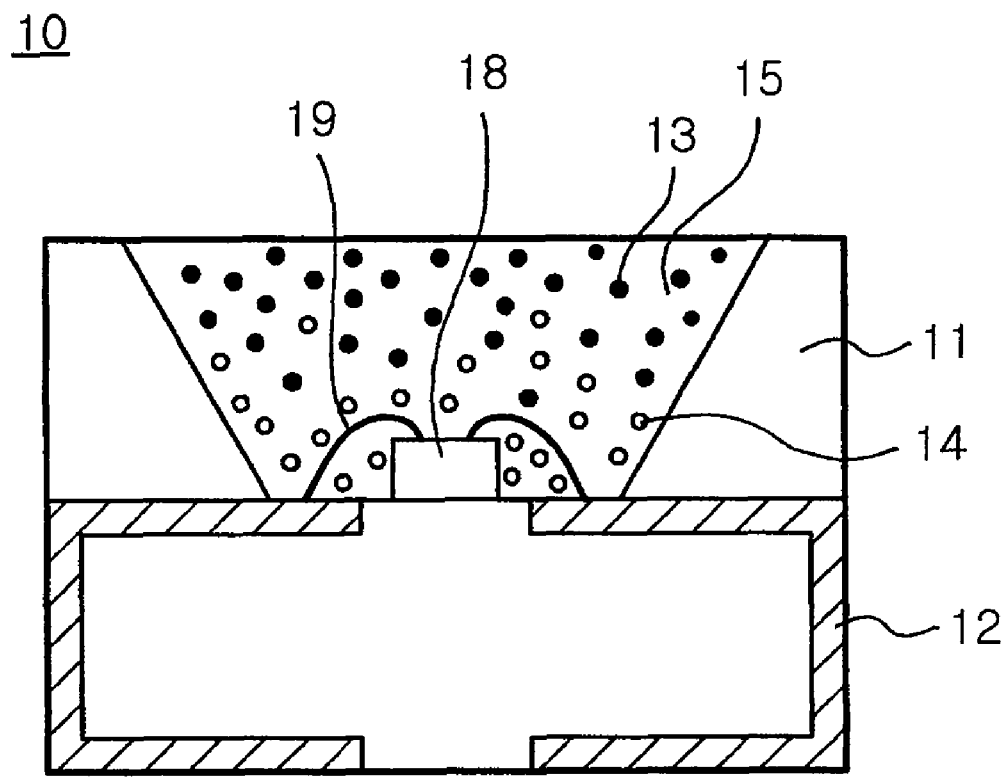
FIG. 3 is a cross-sectional view illustrating a conventional light emitting device using phosphor mixtures.
Figure 6:
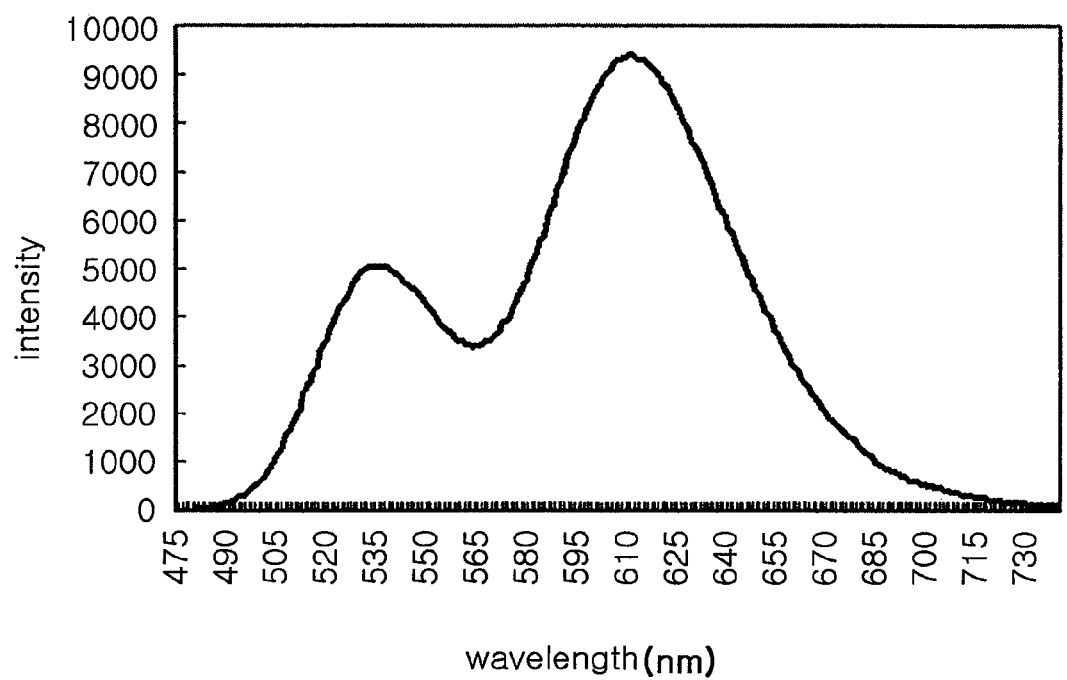
FIGS. 6 to 11 are graphs illustrating emission spectrums of composite phosphor powders according to various embodiments of the invention.

First, FIG. 6 depicts an emission spectrum of a composite phosphor powder having a composition expressed by 80% SrS:Eu and 20% $SrGa_2S_4$:Eu, which contains a red phosphor of SrS:Eu and a green phosphor of $SrGa_2S_4$:Eu at a ratio of 80% and 20%. As shown in FIG. 6, the composite phosphor powder exhibits a new spectrum of a broader wavelength compared to a spectrum (refer to FIGS. 1 and 3) of a conventional individual phosphor. The emission spectrum can be adjusted by varying a content ratio of the phosphors.

Figure 7:
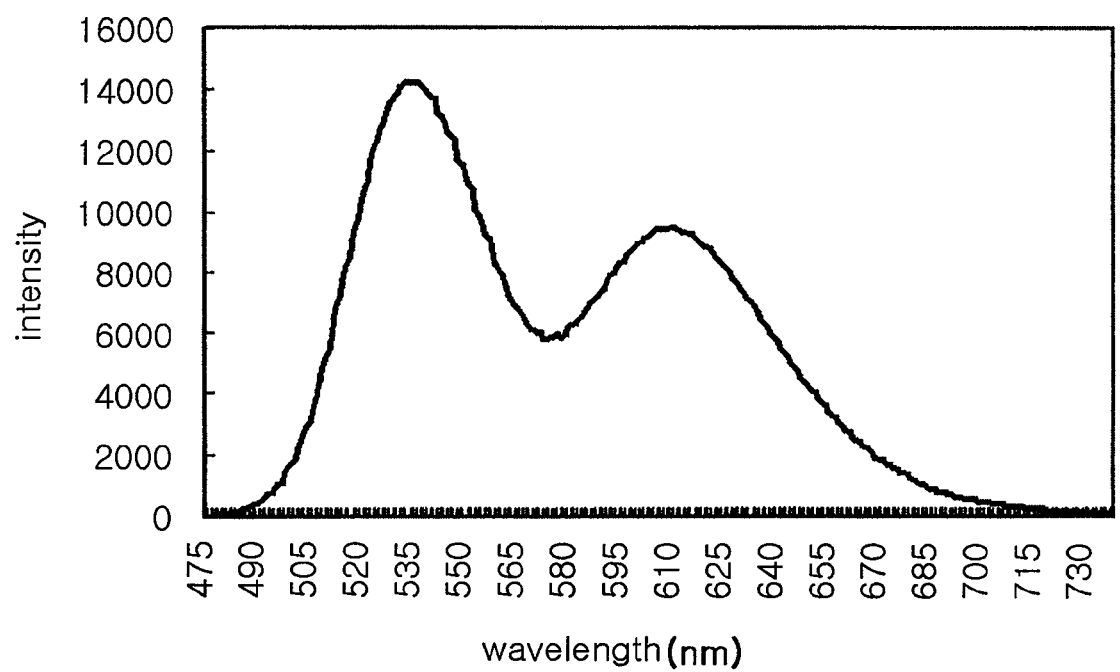

FIG. 7 depicts an emission spectrum of a composite phosphor powder having a composition expressed by 50% SrS:Eu and 50% $SrGa_2S_4$:Eu, which contains a red phosphor and a green phosphor. As apparent from the spectrums of FIGS. 6 and 7, even in a case where individual phosphors of the same type are used, an emission spectrum of the composite phosphor powder is varied by a content ratio. Therefore, variation in the content ratio leads to diversity in the emission spectrum.

Figure 8:
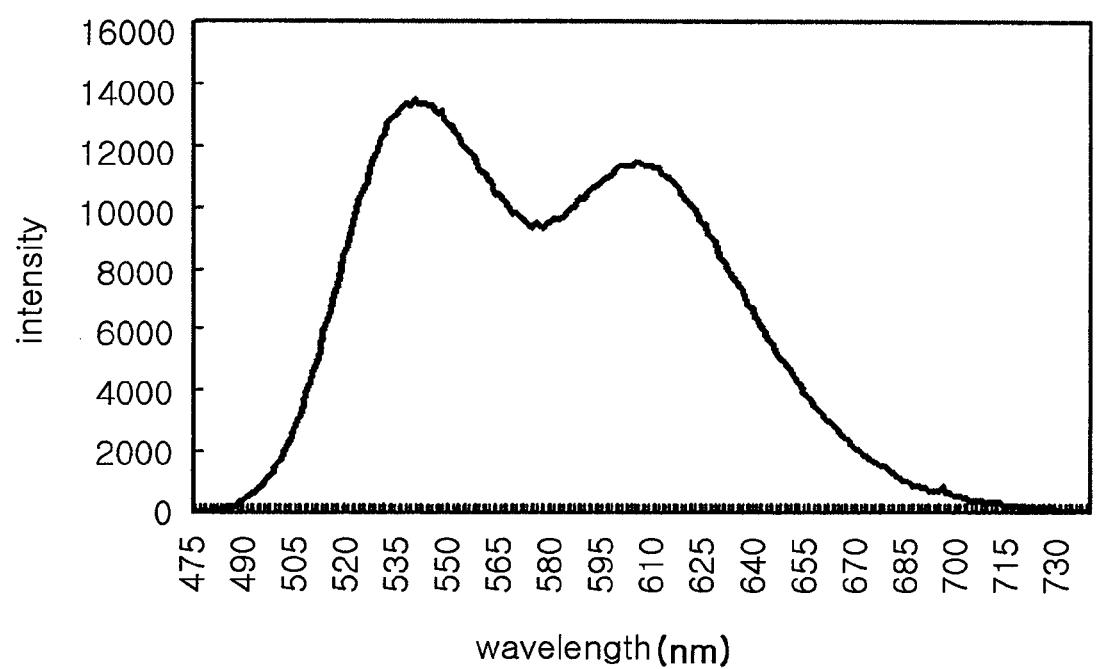

FIG. 8 represents an emission spectrum of a composite phosphor powder having a composition expressed by 40% SrS:Eu, 40% $SrGa_2S_4$:Eu and 20% YAG:Ce, which contains a red phosphor, a green phosphor and a yellow phosphor. As shown in FIG. 8, the composite phosphor powder emits visible light of high intensity at a wavelength ranging from 500 to 650 nm.

Figure 9:
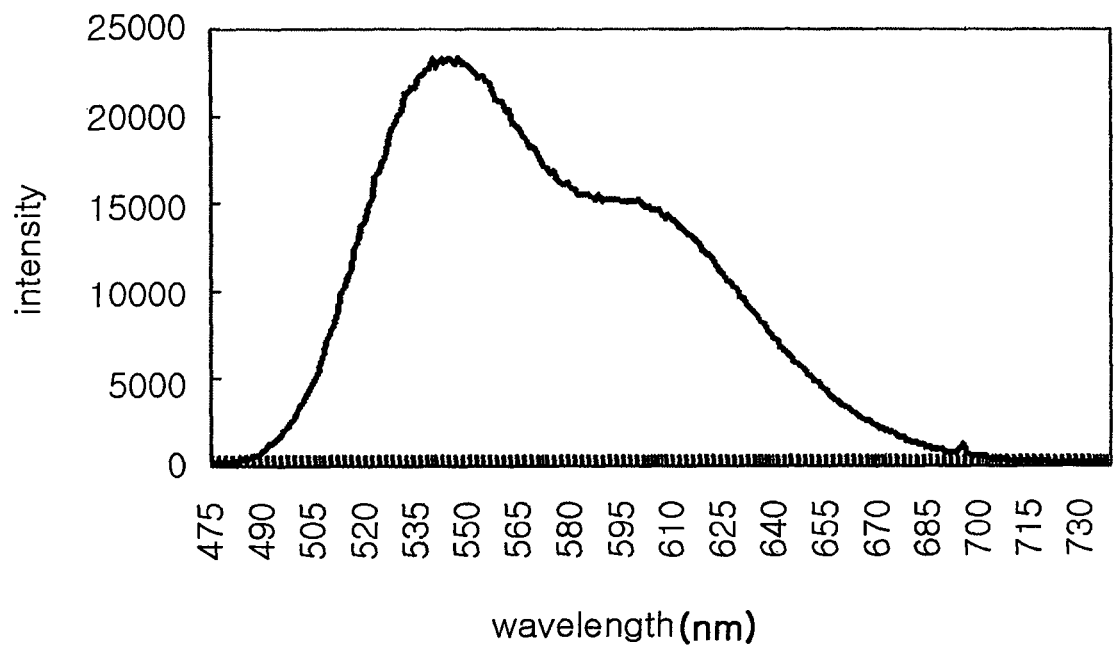

FIG. 9 represents an emission spectrum of a composite phosphor powder having a composition expressed by 30% SrS:Eu, 30% $SrGa_2S_4$:Eu and 40% YAG:Ce, which contains a red phosphor, a green phosphor and a yellow phosphor. As shown in FIGS. 8 and 9, the content ratio of the phosphors is varied to adjust the emission spectrum thereof. Therefore, adjustability of the content ratio of the phosphors allows the emission spectrum to be designed diversely.

Figure 10:
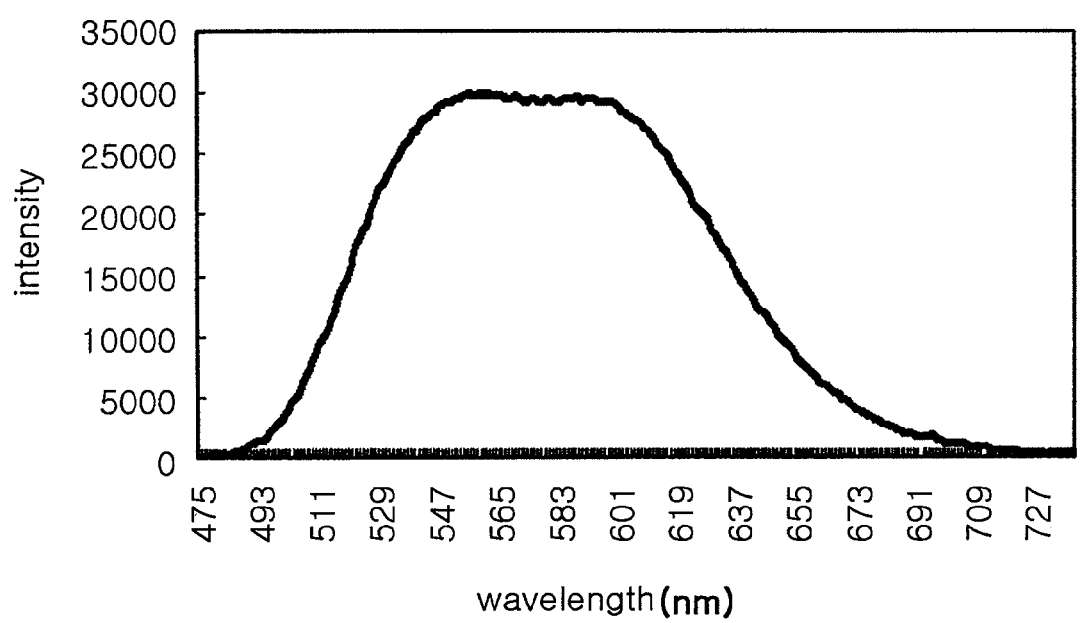

FIG. 10 depicts an emission spectrum of a composite phosphor powder having a composition expressed by 35% SrS:Eu, 35% $SrGa_2S_4$:Eu, 15% YAG:Ce, and 15% ZnSeS:Cu, which contains a red phosphor, a green phosphor, a yellow phosphor and an orange phosphor. As shown in FIG. 10, very high and uniform emission intensity is plotted at a wavelength of 540 to 610 nm. In this fashion, the number of the phosphor types is increased to produce more various types of emission spectrums in a broad wavelength range.

Figure 11:
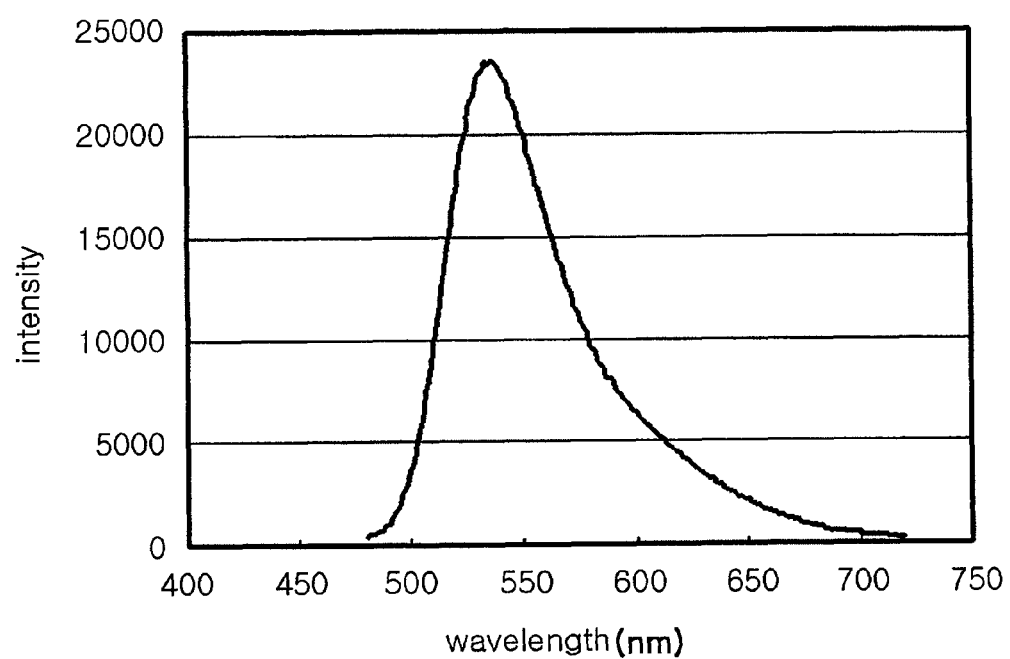
Figure 12:
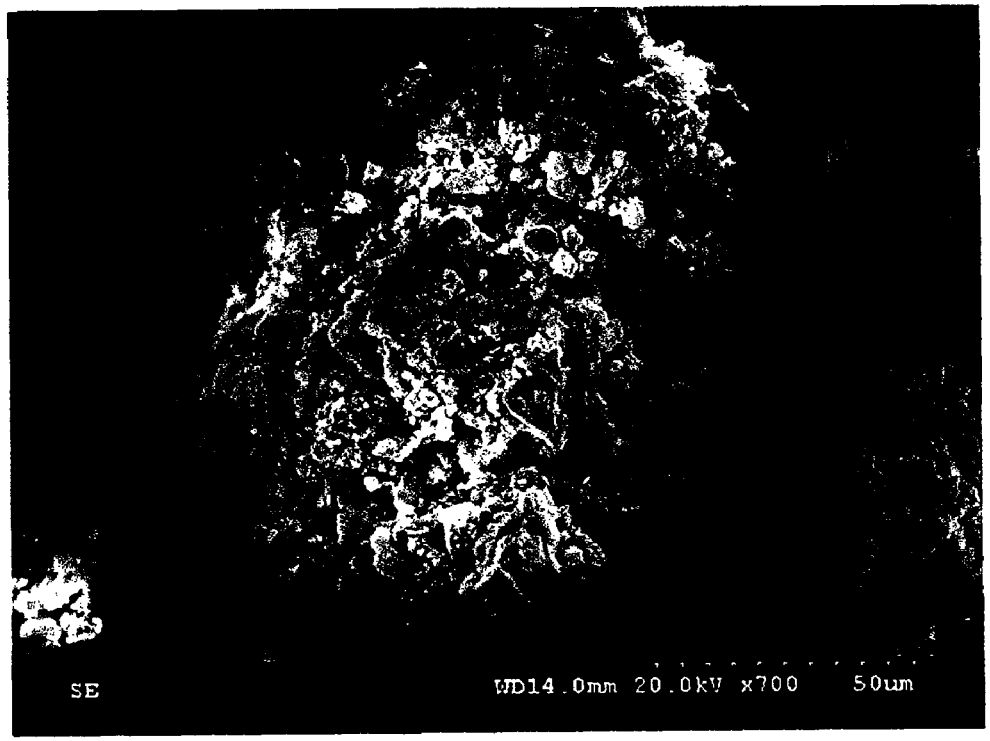
FIG. 12 is a SEM picture illustrating composite phosphor particles according to an embodiment of the invention.

FIG. 11 depicts an emission spectrum of a composite phosphor powder having a composition expressed by 50% $SrGa_2S_4$: Eu and 50% YAG:Ce, which contains a green phosphor and a yellow phosphor. As shown in FIG. 11, the spectrum of the composite phosphor powder exhibits a peak emission wavelength in a yellow-green area. FIG. 12 is a SEM picture illustrating particles of a composite phosphor having a composition expressed by 50% $SrGa_2S_4$:Eu and 50% YAG:Ce, which carries the spectrum of FIG. 11. As shown in FIG. 12, individual phosphors contained in the composite phosphor particle prevent occurrence of a layering phenomenon as in the prior art (refer to FIG. 3).

As apparent from the emission spectrum of the composite phosphor powders according to the various embodiments, the invention ensures diversity in emission spectrum and accordingly in color reproduction index, color temperature and color. Furthermore, according to the invention, a layering phenomenon (refer to FIG. 3) as in the prior art does not take place so that a designed emission spectrum can be precisely achieved.

A method for manufacturing a composite phosphor powder will be explained hereunder according to an embodiment of the invention.

First, at least two types of phosphor particles and a light transmitting binder are mixed together to form a precursor of a composite phosphor. For example, a green phosphor of $SrGa_2S_4$:Eu and a yellow phosphor of YAG:Ce are mixed with an epoxy used as a filler to obtain the precursor (precursor of the composite phosphor). Alternatively, alkoxide used as a water hardening agent may be added to be mixed together.

Next, a surfactant of Poly Acril Amide (PAA) is mixed in distilled water to produce a dispersion medium, which is then mixed with the precursor. When the dispersion medium mixed with the precursor is stirred, the surfactant sticks onto an interface between epoxy binding the phosphors together and distilled water. This produces stabilized unit particles of the composite phosphor (including phosphor particles of $SrGa_2S_4$:Eu and YAG:Ce and epoxy filled therebetween).

Thereafter, the dispersion medium is heated to about 100° C. to remove a solvent (distilled water) and cure epoxy. This solidifies the composite phosphor particles. The composite phosphor particles include the phosphors of $SrGa_2S_4$:Eu and YAG:Ce and the epoxy binding them together. The composite phosphor powder is comprised of the composite phosphor particles.

In this embodiment, epoxy is employed as a light transmitting binder but a silicone resin may be substituted therefor. Also, in this embodiment, distilled water is employed as a dispersion medium for dispersing the precursor but alcohol may be substituted therefor. The composite phosphor powder obtained thereby is combinable with an LED chip to easily manufacture a light emitting device.

Figure 13:
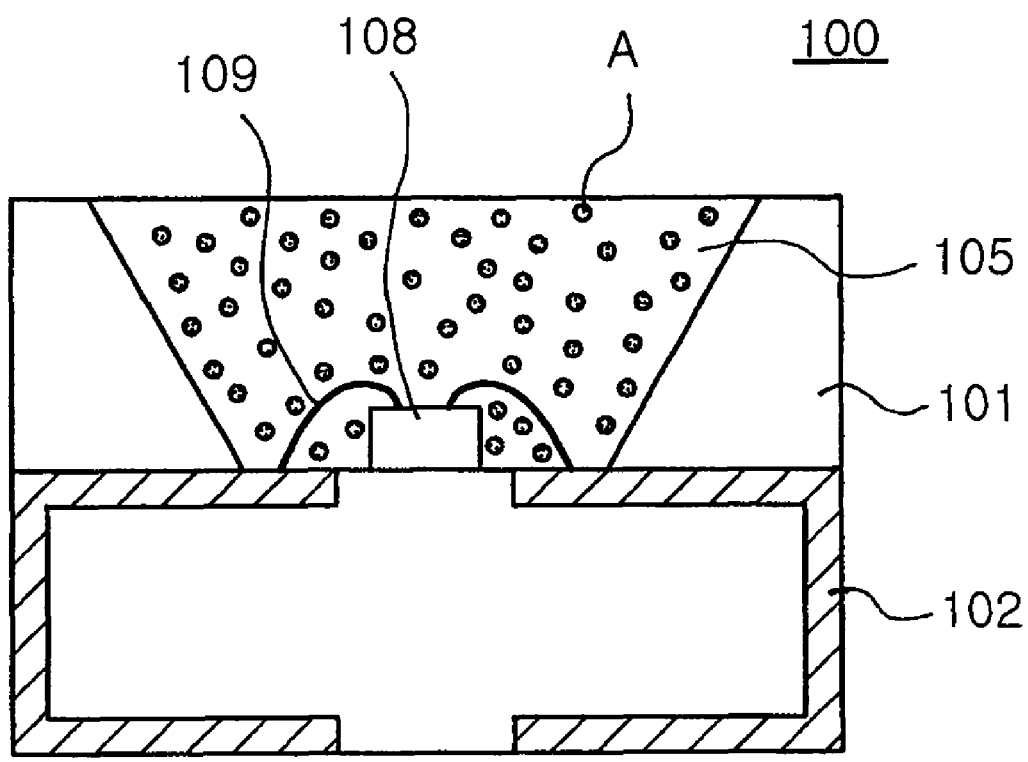
FIG. 13 is a cross-sectional view illustrating a light emitting device using a composite phosphor powder according to still another embodiment of the invention

FIG. 13 is a cross-sectional view illustrating an exemplary light emitting device using a composite phosphor powder according to the invention. Referring to FIG. 13, in the light emitting device 100, an LED chip 108 is mounted in a recess of a housing 101. Aside of the recess of the housing 101 serves as a reflecting surface. Terminal electrodes 102 disposed in the housing 101 are connected to the LED chip 108 via bonding wires 109. A molding resin 105 for encapsulating the LED chip 108 has composite phosphor particles A dispersed therein. As shown in FIG. 13, all the composite phosphor particles A are similarly dense, thereby preventing incidence of a layering phenomenon as in the prior art. Accordingly, uniform and precise color is produced.

The composite phosphor powder of preferred embodiments of the invention can be advantageously employed in a white light emitting device using the LED chip. For example, the composite phosphor powder of the invention is applicable to an LED package device capable of achieving color reproduction index and color temperature which approximate natural white light.

As set forth above, according to preferred embodiments of the invention, a composite phosphor powder employed emits light in a variety of spectrums and precisely ensures diversity in color temperature, color and color reproduction index. Especially, the composite phosphor powder can be applied to an LED device, thereby producing light with various color temperatures and color reproduction indexes, which includes white light or polychromatic light of other wavelengths.

While the present invention has been shown and described in connection with the preferred embodiments, it will be apparent to those skilled in the art that modifications and variations can be made without departing from the spirit and scope of the invention as defined by the appended claims.

What is claimed is:

1. A method for manufacturing a composite phosphor powder, comprising steps of:
    mixing at least two types of phosphor particles with a light transmitting binder to form a precursor of a composite phosphor;
    mixing a dispersion medium added with a surfactant with the precursor and stirring the mixture to form stabilized unit particles of the composite phosphor within the dispersion medium; and
    heating the dispersion medium to cure the light transmitting binder, thereby solidifying composite phosphor particles,
    wherein the light transmitting binder comprises an epoxy resin or a silicone resin.

2. The method according to claim 1, wherein the dispersion medium comprises distilled water.

3. The method according to claim 2, wherein a water hardening agent is added to the precursor.

4. The method according to claim 1, wherein the dispersion medium comprises alcohol.

5. A method for manufacturing a composite phosphor powder, comprising steps of:
    mixing at least two types of phosphor particles with a light transmitting binder to form a precursor of a composite phosphor;
    mixing a dispersion medium added with a surfactant with the precursor and stirring the mixture to form stabilized unit particles of the composite phosphor within the dispersion medium; and
    heating the dispersion medium to cure the light transmitting binder, thereby solidifying composite phosphor particles, wherein the dispersion medium comprises distilled water, and the surfactant comprises Poly Acryl Amide (PAA).

6. A light emitting device comprising:
a light emitting diode chip;
a molding resin for encapsulating the light emitting diode chip; and
a composite phosphor powder dispersed within the molding resin, the composite phosphor powder comprising composite particles, wherein each of the composite particles comprises at least two types of phosphor particles having different emission spectrums and a light transmitting binder for binding the phosphor particles, the light transmitting binder formed between the phosphor particles.

7. The light emitting device according to claim 6, further comprising a housing having a recess for seating the light emitting diode chip therein.

8. The light emitting device according to claim 6, the light transmitting binder binds the phosphor particles to maintain a shape of individual composite particle.

* * * * *